United States Patent [19]
Murayama

[11] Patent Number: 5,670,429
[45] Date of Patent: Sep. 23, 1997

[54] PROCESS OF CONVEYING AN ENCAPSULATED ELECTRONIC COMPONENT BY ENGAGING AN INTEGRAL RESIN PROJECTION

[75] Inventor: Tomohiro Murayama, Fukuoka, Japan

[73] Assignee: Rohm Co. Ltd., Kyoto, Japan

[21] Appl. No.: 260,047

[22] Filed: Jun. 16, 1994

[30] Foreign Application Priority Data

Jun. 30, 1993 [JP] Japan ................... 5-189227
Jun. 30, 1993 [JP] Japan ................... 5-189228

[51] Int. Cl.$^6$ ............ H01L 21/56; H01L 21/58; H01L 21/68
[52] U.S. Cl. ............ 437/210; 437/211; 437/212; 437/216; 437/217; 437/222; 437/243; 264/272.17
[58] Field of Search ................ 437/210, 212, 437/924, 923, 216, 222, 211, 217, 243, 207; 29/418; 257/730; 264/272.17, 161

[56] References Cited

U.S. PATENT DOCUMENTS

| 4,936,734 | 6/1990 | Osada . | |
|---|---|---|---|
| 4,954,308 | 9/1990 | Yabe et al. | 264/272.17 |
| 5,051,813 | 9/1991 | Schneider et al. | 257/730 |
| 5,369,058 | 11/1994 | Burns et al. | 437/209 |

FOREIGN PATENT DOCUMENTS

| 0092274 | 10/1983 | European Pat. Off. . |
| 4039828 | 6/1992 | Germany . |
| 54-124680 | 9/1979 | Japan . |
| 55-127026 | 10/1980 | Japan . |
| 56-13738 | 2/1981 | Japan . |
| 60-111445 | 6/1985 | Japan . |
| 60-211961 | 10/1985 | Japan . |
| 60-245155 | 12/1985 | Japan . |
| 61-35911 | 2/1986 | Japan . |
| 62-52952 | 3/1987 | Japan . |
| 63-153844 | 6/1988 | Japan . |
| 63-237422 | 10/1988 | Japan . |
| 63-269551 | 11/1988 | Japan . |
| 1-28132 | 1/1989 | Japan . |
| 137041 | 2/1989 | Japan . |
| 1212453 | 8/1989 | Japan . |
| 274055 | 3/1990 | Japan . |
| 287654 | 3/1990 | Japan . |
| 2128452 | 5/1990 | Japan . |
| 2239651 | 9/1990 | Japan . |
| 347722 | 2/1991 | Japan . |
| 3105952 | 5/1991 | Japan . |
| 3215964 | 9/1991 | Japan . |
| 541467 | 2/1993 | Japan . |

OTHER PUBLICATIONS

European Search Report dated Dec. 5, 1994 in EPO Application No. 94110096.8.

Primary Examiner—David E. Graybill
Attorney, Agent, or Firm—Brumbaugh, Graves, Donohue & Raymond

[57] ABSTRACT

A process for manufacturing an encapsulated electronic part having a resin body and an inwardly tapered projecting holding member removably attached to the resin body which may be made of the same resin and formed at the same time as the resin body, The encapsulated electronic part may be conveyed to a test device or to a circuit board and mounted thereon by gripping the holding member with a holding device. The holding member may have a shape conforming to the shape of the holding device and may be separated from the resin body by moving the holding device while holding the resin body stationary.

5 Claims, 3 Drawing Sheets

PROCESS OF CONVEYING AN ENCAPSULATED ELECTRONIC COMPONENT BY ENGAGING AN INTEGRAL RESIN PROJECTION

BACKGROUND OF THE INVENTION

The present invention relates to a method of packaging circuits having electronic circuit components such as ICs, capacitors, transistors, diodes and the like, and to a packaged circuit arrangement.

Electronic circuit components such as ICs are generally manufactured and packaged in the following manner.

First, molten resin is injected through a die gate into a series of die cavities containing semiconductor circuit components mounted on spaced portions of a beltlike lead frame member extending through the cavities so as to encapsulate the circuit components in separate resin body packages. The resin is cooled and the die gate runner is removed from the encapsulated components, and the lead frame is then divided by punching to produce separate resin bodies containing ICs.

The ICs are then carried and deposited in order on a chute having beltlike grooves and moved to a predetermined position.

In one arrangement, the ICs are carried by a suction collet which exerts suction produced by a vacuum created by a vacuum pump and the suction collet engages a surface of the resin body of the encapsulated IC to hold it while it is being carried. The suction collet is connected to a motor-driven positioning slide which is movable in horizontal and vertical directions so as to convey the ICs one after another past an inspection station.

The piping from the vacuum pump to the suction collet is arranged with a pneumatic sensor, for example, which detects engagement of a resin body by the suction collet, and the completion of movement of each IC may also be identified thereby.

At the inspection stage, each IC conveyed to an inspection device such as an electrical measuring socket is subjected to quality inspection and only the good ICs are conveyed on a conveyor belt to a predetermined position at the next stage of manufacture, while the defective ones are removed.

When an encapsulated IC has thus been inspected and conveyed to the predetermined position, a chuck is used to grip and move the encapsulated IC onto a circuit board on which electronic parts are assembled and then packaged.

However, the following problems are encountered in the prior art methods of holding and moving packaged ICs containing electronic parts for inspection and for mounting on circuit boards.

When packaged ICs are conveyed using a suction-type collet, for example, a resin burr produced when the lead frame is encapsulated may cling to the surface of the resin body of the IC produced at the punching stage. While being conveyed on the conveyor, the resin burr may cause the IC to shift from the chute groove so that, when it is moved to a predetermined position, the surface of the IC engaged by the suction collet is tilted, thus preventing the IC from being conveyed because of leakage of air through the gap between the surface of the resin body and the suction collet.

Moreover, an IC may tend to twist or slip with respect to the suction collet while being conveyed if it is not retained with the full suction. In other words, it can shift easily from the predetermined position, and this often causes a failure of conveyance.

Although the vacuum holding the IC is released after the IC is satisfactorily conveyed, the suction collet may still be attached to the IC and may thus shift it from the proper position when the suction collet is moved away, also causing a failure of conveyance. The above-mentioned vacuum sensor is unable to identify trouble of this type and allows the suction collet to continue to operate.

Instead of the above-described suction-type collet, a chuck driven by an air cylinder which opens and closes in accordance with applied air pressure to grip the resin-sealed member of the IC is also used for holding and conveying encapsulated semiconductor devices. The following problems are encountered in conveying ICs by causing chucks to grip the resin body of encapsulated ICs.

The resin burr and dust produced at the punching stage tend to cling to the undersurface of the resin body of the encapsulated IC. When the IC is conveyed to a predetermined position in the chute, it may tilt with respect to the surface of the chute because of burrs or dust. This can cause the resin body of the IC to be partially broken or deformed as the tilted IC is gripped by the chuck. Moreover, the leads of the IC may be bent or disconnected by the improper gripping of the chuck, resulting in a defective external condition. This reduces the yield rate.

Since the resin body of the IC is gripped directly by the chuck, the chuck must have a complicated configuration so as to match the external shape of the encapsulated IC and such a chuck configuration requires complex machining.

Furthermore, the external shape of an encapsulated IC varies according to the type of IC so that a special chuck is needed for each type of IC. This means that the conveying chuck must be replaced when different types of ICs are manufactured on the same equipment, and the chucks which are not in use must be stored safely. Therefore, the manufacture of ICs is very inconvenient.

In addition, when a chuck is used to grip the resin body and move the encapsulated IC onto a circuit board for packaging purposes, it tends to interfere with other electronic parts adjacent to the IC being mounted on the board. To avoid this, sufficient space must be provided between adjacent ICs and the IC being mounted on the board so that the chuck cannot damage another electronic part, and this necessitates a larger part-to-part spacing. Therefore, it has not been possible to provide a dense configuration of electronic parts mounted on a circuit board.

Moreover, the presence or absence of defective electronic parts actually mounted on the circuit board requires visual inspection by a worker and this has reduced manufacturing efficiency.

SUMMARY OF THE INVENTION

Accordingly, it is an object of the present invention to provide a method of packaging and conveying encapsulated electronic parts which overcomes the disadvantages of the prior art.

Another object of the invention is to provide a method of packaging and assembling electronic parts on a circuit board which provides not only greater density of the parts on the board, but also high efficiency.

A further object of the present invention is to provide a method of producing electronic parts which a yield rate which is improved by reducing defective external conditions of electronic parts such as cut-outs, deformation and the like so that improved manufacturing efficiency is also provided.

These and other objects of the invention are attained by forming a resin body having an encapsulated semiconductor element and having a holding member projecting away from the surface of the resin body, and conveying the encapsulated element to a predetermined position by holding the holding member with a holding device driven by a moving mechanism for moving the holding member and the attached encapsulated element in horizontal and vertical directions. The encapsulated element may thus be conveyed to an inspection station or to a circuit board for mounting and, thereafter, the holding member may be separated from the resin body by moving the holding device with respect to the resin body.

The holding member connected to the surface of the resin body, which may have a cylindrical shape, is held with the holding device and conveyed to a predetermined position where the resin body is inspected and is then conveyed to a circuit board, where it is assembled to circuitry before the cylindrical member is removed from the resin body. Encapsulated electronic parts are thus assembled without deformation.

A packaged circuit assembly having a plurality of assembled electronic parts is provided by forming an electronic part having a resin body molded to shape and containing an encapsulated semiconductor element and forming a holding member, which may have a cylindrical or rectangular shape, connected to and projecting away from a predetermined portion of the resin body, and conveying the electronic part to a packaging circuit while gripping the holding member with a holding device.

With this arrangement, the resin body with an encapsulated semiconductor element and the holding member connected to a predetermined portion of the resin body can both be formed at the encapsulation stage in the manufacture of electronic parts. Thus, the resin body, which is easily damaged and has a complicated configuration, is not gripped directly by the holding device during the conveyance and assembly of the electronic parts. Instead, the holding member of each resin body is gripped firmly so that a circuit assembly containing a plurality of electronic components is easily packaged.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
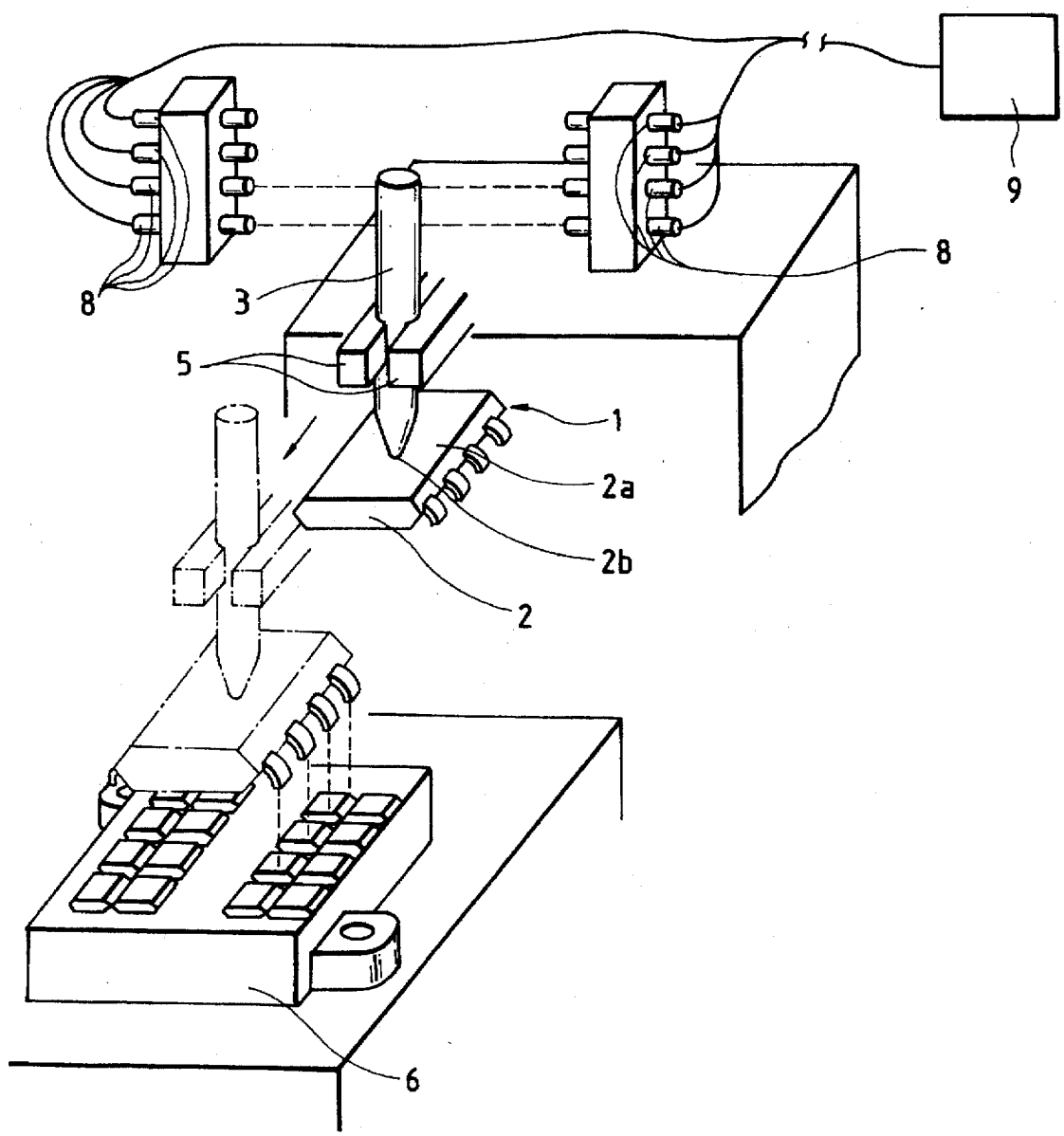
FIG. 1 is a schematic diagrammatic perspective view illustrating conveying of an encapsulated element in a representative embodiment of the present invention.

In the representative embodiment of the invention shown in FIG. 1, a conveying arrangement for the conveying of encapsulated electronic parts between punching and inspection stations is illustrated.

In this embodiment, a molded piece 1 comprises a resin body 2 and a resin bar 3 projecting perpendicularly from the upper surface of the resin body. The resin body 2 is molded to shape by injecting molten resin into a die cavity (not shown) through a die gate coupled to the substantially central portion of the top face of the die cavity and encapsulating a semiconductor element which is mounted on a part of a lead frame (not shown) in a conventional manner. The lead frame is of a conventional type having a series of adjacent portions on which semiconductor elements are mounted and are separately encapsulated, the semiconductor elements being arranged at fixed intervals in the longitudinal direction of the lead frame.

The resin bar 3 is formed from resin retained in a gate member leading to the die gate for the resin body 2. At the punching stage, the lead frame which has been formed with a plurality of molded pieces 1 encapsulating adjacent semiconductor elements is divided by punching to obtain separate molded pieces 1. In the illustrated embodiment, the resin bar 3 is a cylindrical member having a conical portion extending up to any desired distance from a coupling 2b between the top surface of the resin body 2 and the resin bar 3.

Figure 4:
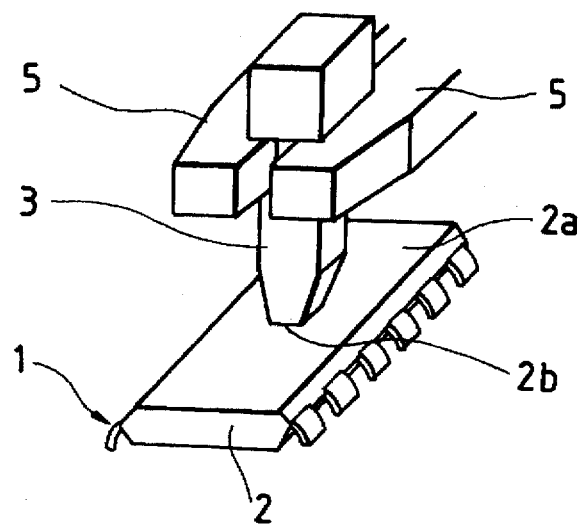
FIG. 4 is a schematic perspective view showing a typical electronic part in the process of manufacture and another form of projecting holding member and holding device according to the present invention.

The resin bar 3 may have the shape of a stepped rectangular prism as shown in FIG. 4, for example, so as to allow a correspondingly-shaped chuck 5 to grip it and hold it in a predetermined orientation.

Figure 2:
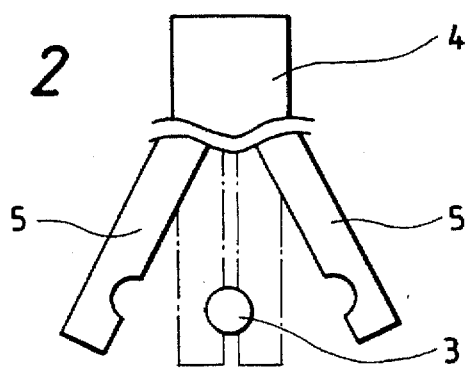
FIG. 2 is a plan view showing the arrangement of a typical holding device for use in holding and conveying encapsulated electronic components according to the present invention.

As shown in FIG. 2, the chuck 5 opens and closes in response to the operation of a pneumatic drive 4 such as an air cylinder. In the operation shown in FIG. 1, the chuck 5 closes to grip the resin bar 3 and thereby holds the molded piece 1 in the desired manner. The molded piece 1, thus supported by the chuck 5 is moved by a slide mechanism connected to, for example, a motor to drive the molded piece 1 in the horizontal or vertical direction as necessary to position it. The molded piece 1 is then inserted into a measuring socket 6.

When the molded piece has been inserted into the measuring socket 6, an inspection device (not shown) connected to the measuring socket 6 is used to determine the quality of the molded piece 1.

Figure 3:
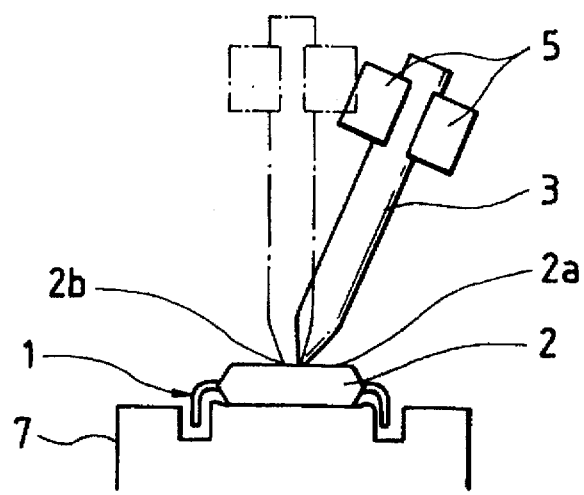
FIG. 3 is a side view of the holding device of FIG. 2 showing the separation of a projecting holding member from a resin body according to the present invention.

If the molded piece 1 passes the quality inspection successfully while being gripped by the chuck 5, the molded piece 1 is separated from the measuring socket 6 and moved to a conveying stand 7, as shown in FIG. 3. If the holding member 3 is not required for any further steps in the manufacturing operation, the molded piece 1 is held by a holding device on the conveying stand 7 (not shown) and the resin bar 3, being gripped by the chuck 5, is rocked with the coupling 2b as the pivot point. The resin bar 3 is thus twisted off the resin body 2 to separate the former from the latter.

Figure 7:
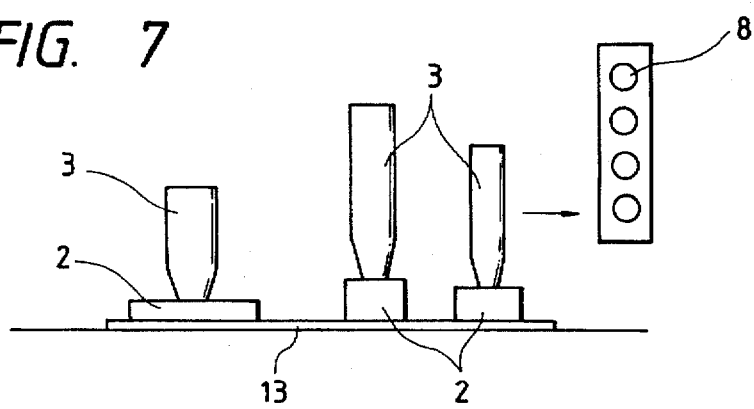
FIG. 7 is a side view of an arrangement for identifying an electronic part in a component-mounting arrangement with a sensor according to the present invention.

The resin bar 3, thus separated, is conveyed by the chuck 5 to a discharge box 12, shown in FIG. 7, and the chuck 5 is opened to drop the resin bar 3 into the discharge box.

Since the chuck 5 does not grip the resin body 2 of the molded piece 1 directly during the conveying and inspection process, as described above, the chuck 5 cannot damage or deform the resin body 2 or the projecting leads. In other words, defects in the external condition of the resin body 2 are substantially eliminated.

Also, because resin bars 3 of the same shape can be provided regardless of the type of encapsulated electronic part, manufacturing efficiency is greatly improved since it is unnecessary to replace the chuck 5 each time a different type of electronic part is manufactured.

With the arrangement described above, both mischucking of molded pieces 1 being conveyed and misconveying of molded pieces 1 resulting from dropping and the like are reduced. When a molded piece 1 must be accurately conveyed onto a measuring socket 6 for inspection by making the chuck 5 grip the resin bar 3 precisely, failures in mounting the molded piece 1 accurately onto the measuring socket 6 because of shifting in the gripping of the resin bar 3 can be eliminated.

In addition, the chuck 5 cannot interfere with any other component parts closely adjacent to the position at which a molded piece 1 has been conveyed, thereby facilitating circuitry miniaturization.

In the embodiment shown in FIG. 1, an identification sensor having photoelectric cells 8 at different selected levels is mounted adjacent to the path along which molded pieces 1 having resin holding bars 3 are conveyed so as to detect the length of the resin bar 3 or the position at which the resin bar 3 is held. Information about each molded piece thus detected is transmitted to a conveyor drive controller 9 which controls the motion of the chuck 5 so as to convey each molded piece 1 to the appropriate socket location dependent upon the detected information. In this way, the appropriate measuring socket 6 and the corresponding molded piece 1 cannot be inadvertently crushed because the molded piece 1 is prevented from being defectively mounted on an inappropriate measuring socket 6.

The molded piece 1 may be made so that the resin bar 3 has a tapered portion extending from the coupling 2b up to any desired distance from the resin body 2. In addition, the length of the resin bar 3 may be selected according to the type of device encapsulated in the resin body 2, which may include ICs, chip resistors, capacitors, or according to the number of pins in the IC so that the type of device can be determined by the sensor 8.

At the molding stage, variations may be made in the manner in which the resin gate is used and also in the simultaneous formation of the resin body 2 and the resin bar 3 in a die cavity. If desired, a previously-formed resin bar 3 may be attached to the molded resin body 2.

Figure 5:
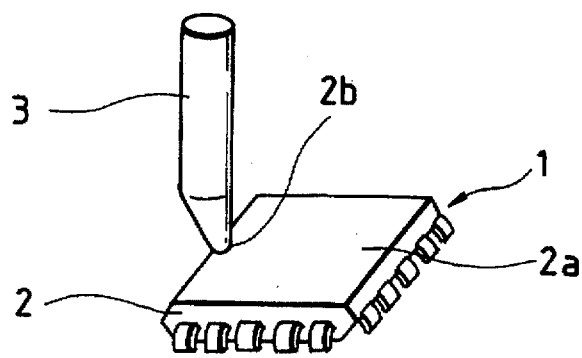
FIG. 5 is a perspective view showing another form of encapsulated electronic part with a projecting holding member according to the present invention.

The location of the coupling 2b between the resin body 2 and the resin bar 3 may be varied as desired. For example, it may be at the peripheral edge on the surface 2a of the molded piece 1, as shown in FIG. 5, or centrally positioned, as shown in FIG. 1, or otherwise positioned on the resin body 2.

Although the projecting holding bar 3 has been described as made of resin, it may also be made of a metal such as iron or aluminum as long as it is capable of being held by a holding device.

Moreover, the projecting bar 3 may be separated from the resin body 2 not only by motion of a holding device such as the chuck 5, but also by a cutter.

Figure 6:
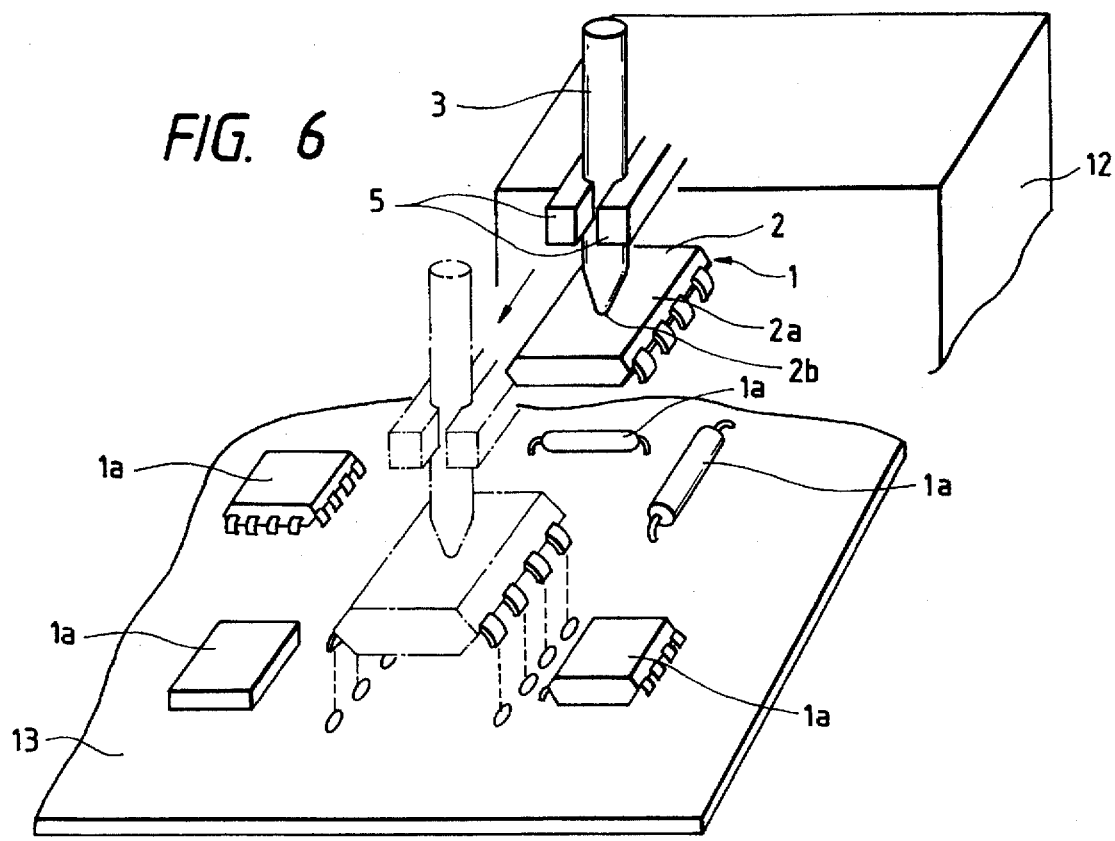
FIG. 6 is a schematic perspective diagrammatic illustration showing a typical method of packaging electronic parts on a circuit board according to the present invention.

FIG. 6 is a perspective diagrammatic illustration of a further embodiment of the invention showing the packaging method of mounting an encapsulated electronic part 2 of the type described above in a packaged circuit such as a printed circuit board 13.

When the electronic part 2 is to be moved into position on a circuit board 13 having a desired wiring pattern for use in forming a packaging circuit by mounting the electronic part, it is moved in the following manner.

First, a chuck 5, which opens and closes in response to the operation of a pneumatic drive 4 such as an air cylinder, as shown in FIG. 2, closes to grip the resin bar 3. The electronic part 1 with the resin bar 3 thus held by the chuck 5 is moved by a drive source such as a motor (not shown) into position on the board 13 where it is mounted.

After being mounted on the circuit board 13 and while still being gripped by the chuck 5, the resin bar 3 is rocked about the coupling 2b and twisted off the encapsulated electronic part 2. The mounting of the electronic part 2 on the circuit board is thus completed.

The resin bar 3 thus separated from the electronic part is conveyed to a discharge box 12 provided on the path through which the semiconductor device 2 is conveyed and, when the chuck 5 is opened, the resin bar is dropped into the discharge box.

As shown in FIG. 7, an identifying sensor 8 described above with respect to FIG. 1 may also be used in connection with the inspection of circuit boards 13 on which electronic components 2 have been mounted. The sensor 8 may be an optical transmission sensor disposed adjacent to one side of the circuit board 13 so as to readily identify the presence or absence of encapsulated electronic parts 2 by detecting their resin bars 3 at an inspection stage after a plurality of the electronic parts have been mounted on the circuit board 13. In this case, the circuit board 13 may be conveyed on, for example, a motor-driven conveyor (not shown) to automate the inspection for the presence or absence of electronic parts on the board 13 by detecting and identifying the resin bars 3 before the resin bars are separated from the resin bodies 2.

As set forth above, the method of packaging a circuit having at least one electronic part according to the present invention comprises the steps of forming a molded piece including a resin body containing an electronic part and a projecting holding member connected to a predetermined portion of the resin body and optionally having a desired shape, and conveying the electronic part while gripping the holding member with a holding device.

Moreover, encapsulated electronic parts in the resin bodies can be conveyed by holding the projecting holding members without directly engaging the resin body containing the part during the process of manufacturing and mounting molded pieces.

Since the holding device is capable of holding and moving the electronic part without gripping it directly, the holding device is prevented from breaking, deforming or damaging the conveyed part or damaging any adjacent electronic part by contact therewith when an electronic part is mounted on a circuit board. Electronic parts can thus be mounted close together.

Therefore, the present invention has the following advantages in the manufacture of semiconductor devices:

(a) Since external damage such as breakage and deformation of the resin body and the leads is reduced, the yield rate is greatly improved.

(b) By providing projecting holding members which are similar in shape for different types of electronic parts, the necessity for replacing the holding device for different types of electronic parts and of providing a large number different holding devices is avoided. Therefore, efficiency and convenience of manufacture are greatly improved.

(c) By providing a simple configuration for the projecting holding member, the holding device can also have a simple shape and therefore be convenient to manufacture.

Although the invention has been described herein with reference to specific embodiments, many modifications and variations therein will readily occur to those skilled in the art. Accordingly, all such variations and modifications are included within the intended scope of the invention.

I claim:

1. A method of manufacturing an electronic circuit comprising:

providing an encapsulated electronic component by forming a resin body having an external top surface and containing an electronic component having exposed leads and having a projection in the form of a resin bar integral with and projecting substantially perpendicularly away from the resin body, the resin bar being tapered inwardly toward a joint at which it is attached to the external top surface of the resin body;

holding the encapsulated electronic component with a holding device engaging the projection; and conveying the encapsulated electronic component to a position by moving the holding device.

2. A method according to claim 1 including:

moving the encapsulated electronic component to a test device; and engaging the exposed leads with the test device by moving the holding device.

3. A method according to claim 1 including:

moving the encapsulated electronic component to a circuit board; and mounting the encapsulated component on the circuit board by moving the holding device.

4. A method according to claim 1 including separating the projection from the resin body at the joint after the electronic component has been conveyed to a position.

5. A method according to claim 4 including separating the projection from the resin body by moving the holding device while the resin body is retained in a fixed position.

* * * * *